(12) United States Patent
Takenaka

(10) Patent No.: US 7,124,070 B2
(45) Date of Patent: Oct. 17, 2006

(54) METHOD OF AND APPARATUS FOR, AND PROGRAM FOR VERIFYING EQUIVALENCE BETWEEN BEHAVIORAL DESCRIPTION AND REGISTER TRANSFER LEVEL DESCRIPTION

(75) Inventor: Takashi Takenaka, Minato-ku (JP)

(73) Assignee: NEC Corporation, Tokyo (JP)

( * ) Notice: Subject to any disclaimer, the term of this patent is extended or adjusted under 35 U.S.C. 154(b) by 675 days.

(21) Appl. No.: 10/283,276

(22) Filed: Oct. 30, 2002

(65) Prior Publication Data
US 2003/0131324 A1 Jul. 10, 2003

(30) Foreign Application Priority Data
Oct. 30, 2001 (JP) ............... 2001-332604

(51) Int. Cl.
G06F 17/50 (2006.01)
(52) U.S. Cl. ...................................................... 703/14
(58) Field of Classification Search .................. 703/14, 703/15, 21, 22; 716/5, 4
See application file for complete search history.

(56) References Cited

U.S. PATENT DOCUMENTS

| | | | |
|---|---|---|---|
| 6,470,482 B1 * | 10/2002 | Rostoker et al. ............... | 716/6 |
| 6,587,590 B1 * | 7/2003 | Pan ............................. | 382/250 |
| 6,691,301 B1 * | 2/2004 | Bowen ........................ | 717/114 |
| 6,718,522 B1 * | 4/2004 | McBride et al. ............... | 716/4 |
| 6,813,201 B1 * | 11/2004 | Zarrineh et al. ............. | 365/201 |
| 6,910,200 B1 * | 6/2005 | Aubel et al. .................. | 716/9 |

OTHER PUBLICATIONS

P. Ashar et al., "Verification of Scheduling in the Presence of Loops Using Uninterrupted Symbolic Simulation", International Conference on Computer Design, (1999), pp. 458-466 with Abstract.
N. Mansouri et al., "Automated Correctness Condition Generation for Formal Verification of Synthesized RTL Designs", Formal Methods of System Design, vol. 16, (2000), pp. 59-91 with Abstract.

* cited by examiner

Primary Examiner—Albert W. Paladini
(74) Attorney, Agent, or Firm—Sughrue Mion, PLLC

(57) ABSTRACT

For deriving an RTL description through several steps from a behavioral description, a behavioral synthesis device outputs an associated relation between intermediate level descriptions subsequent to the respective steps and intermediate level descriptions prior to the respective steps. A model extracting device extracts a model capable of expressing a control structure based on a finite state machine and an update of a signal from the behavioral description, each of the intermediate level descriptions, and the RTL description, as a model corresponding to those descriptions. A signal value function extracting device extracts signal value functions from the model. A function equivalence comparing device checks the equivalence between signal value functions prior and subsequent to the steps of the behavioral synthesis device.

28 Claims, 15 Drawing Sheets

FIG. 2

```
input    i, j ;
output   o ;
variable a, b, c, d, e, f ;
main () {
 a = i ; b = i ;
 c = d = e = f = 1 ;
 if ( a < b )      {
   func1 () ;
   e = a + b + d ;
   func2 () ;
   } else  {
   a = b ;
   }
   while ( c < a )     {
   o = c ;
   c = c + e ;
   }
} func1 () {
   if ( a > 0 )      {
     a = a * 2 ;
     c = b - 2 ;
     } else  {
     a = a - 2 ;
     d = a + 3 ;
     }
} func2 () {
   if ( b > 0 )      {
     o = e ;
     } else  {
     e = c + d ;
     }
}
```

FIG. 3

```
input    i, j ;
output   o ;
variable a, b, c, d, e, f ;
main () {
L01 :
    a = i ; b = 1 ;
    c = d = e = f = 1 ;
    if ( a < b ) {
     if ( a > 0 ) {
        a = a * 2 ;
        c = b - 2 ;
     } else {
        a = a - 2 ;
        d = a + 3 ;
     }
     e = a + b + d ;
     if ( b > 0 ) {
        o = e ;
     } else {
        e = c + d ;
     }
    } else {
      a = b ;
    }

L02 :
    if ( c < a ) {
      o = c ;
      c = c + e
      goto L02 ;
    } else {
      goto L03 ;
    }

L03 :
    halt ;
}
```

FIG. 4

```
input in0, in1 ;
output out0 ;
terminal RG01_t, RG02_t, RG03_t, RG04_t ;
register RG01, RG02, RG03, RG04 ;
main () {
ST1 :
  RG01_t = in0 ;
  RG02_t = in1 ;
  RG01 = RG01_t ;
  RG02 = RG02_t ;
  RG03 = 0 ;
  RG04 = 0 ;
  if ( RG01_t < RG02_t )    {
    if ( RG01_t > 0 )      {
      goto ST2 ;
      } else  {
      goto ST3 ;
      }
    } else  {
    goto ST4 ;
    }
ST2 :
  RG01 = RG01 + 2 ;
  RG03 = RG02 - 2 ;
  goto ST5 ;
ST3 :
  RG01 = RG01 - 2 ;
  RG04 = RG01 + 3 ;
  goto ST5 ;
ST4 :
  RG01 = RG02 ;
  goto ST5 ;

ST5 :
  if ( RG01 < RG02 )    {
    if ( RG02 > 0 )     {
      goto ST6
      } else  {
      goto ST7
      }
    } else  {
    goto ST8 ;
    }
ST6 :
  RG04_t = RG01 + RG03 + RG04 ;
  RG04 = RG04_t ;
  out0 = RG04_t ;
  goto ST8 ;
ST7 :
  RG04 = RG03 + RG04 ;
  goto ST8 ;
ST8 :
  if ( RG03 < RG01 )    {
    out0 = RG03 ;
    RG03 = RG03 + RG04 ;
    goto ST8 ;
    } else  {
    goto ST9 ;
    }
ST9 :
  halt ;
```

FIG. 7

| EFSM2 | | EFSM3 | |
|---|---|---|---|
| block | signal | block | signal |
| L01 | i1 | L11 | in0 |
| | i2 | | in1 |
| | ○ | | out0 |
| L02 | i1 | L12 | in0 |
| | i2 | | in1 |
| | ○ | | out0 |
| | ■ | | RG01 |
| | ○ | | RG03 |
| | ● | | RG04 | total processing sequence processing sequence of step 1 in detail

Detailed flow of step 12

FIG. 14

Initial assignment $$V(S0, S0)(x) = \begin{pmatrix} i \\ j \\ o \\ a \\ b \\ c \\ d \\ e \end{pmatrix} \xrightarrow{\substack{\text{Process} \\ \text{transition} \\ \text{from S0 to S1}}} V(S0, S1)(x) = \begin{pmatrix} inp(i) \\ inp(j) \\ o \\ i \\ j \\ 1 \\ 1 \\ 1 \end{pmatrix}$$

$C(S0, S0)(x) = TRUE \qquad\qquad C(S0, S1)(x) = TRUE$

FIG. 15

$$V(S0, S1)(x) = \begin{pmatrix} inp(i) \\ inp(j) \\ o \\ i \\ j \\ 1 \\ 1 \\ 1 \end{pmatrix} \xrightarrow{\substack{\text{Process} \\ \text{transition} \\ \text{from S1 to S2}}} V(S0, S2)(x) = \begin{pmatrix} inp(i) \\ inp(j) \\ o \\ i \\ j \\ 1 \\ 1 \\ 1 \end{pmatrix}$$

$C(S0, S1)(x) = TRUE \qquad\qquad C(S0, S2)(x) = i < j$

FIG. 16

$$V(S0, S4)(x) = \begin{pmatrix} inp(i) \\ inp(j) \\ o \\ i+2 \\ j \\ j-2 \\ 1 \\ 1 \end{pmatrix}$$

Process confluence transition to a state S7

$C(S0, S4)(x) = (i < j) \,\&\, (i > 0)$ $$V(S0, S6)(x) = \begin{pmatrix} inp(i) \\ inp(j) \\ o \\ i-2 \\ j \\ 1 \\ i+3 \\ 1 \end{pmatrix}$$

$\Longrightarrow$ $$V(S0, S7)(x) = \begin{pmatrix} inp(i) \\ inp(j) \\ o \\ (ite\,(i > 0), i+2, i-2) \\ j \\ (ite\,(i > 0), i-2, 1) \\ (ite\,(i > 0), 1, i+3) \\ 1 \end{pmatrix}$$

$C(S0, S7)(x) = i < j$ $C(S0, S6)(x) = (i < j) \,\&\, !(i > 0)$

Detailed flow of step 13

METHOD OF AND APPARATUS FOR, AND PROGRAM FOR VERIFYING EQUIVALENCE BETWEEN BEHAVIORAL DESCRIPTION AND REGISTER TRANSFER LEVEL DESCRIPTION

BACKGROUND OF THE INVENTION

1. Field of the Invention

The present invention relates to a logic circuit equivalence verifying apparatus for verifying whether a plurality of logic circuits are logically equivalent to each other or not, and more particularly to an apparatus for verifying whether a behavioral description as an input to a behavioral synthesis system and a register transfer level description which is an output from the behavioral synthesis system are equivalent to each other or not.

2. Description of the Related Art

For designing LSI or VLSI circuits, it is general practice to employ an LSI design automation/support technology for automatizing or supporting the designing of LSI or VLSI circuits. One typical process of VLSI designing processes which employ the LSI design automation/support technology is a top-down design process using various EDA (electronic design automation) tools. The top-down design process is generally divided into a function design process, a logic design process, and a layout design process successively from its upstream step. Of these processes, automation of the function design process is referred to as behavioral synthesis (also high-level synthesis or functional synthesis), and automation of the logic design process is referred to as logic synthesis.

Specifically, according to the top-down design process, system specifications are produced by regarding an entire LSI circuit as a system and describing its behavior. The description thus generated is referred to as a behavioral description. The behavioral description is generating using a language like the C language, for example.

Then, in a behavioral synthesis phase, the generated behavioral description is automatically converted into an RTL (register transfer level) description. Heretofore, it has often been customary to manually perform the behavioral synthesis phase to generate an RTL description using an HDL (hardware description language).

Thereafter, in a logic synthesis phase, the RTL description is automatically converted into a gate level description (gate level logic circuit: net list). Based on the net list thus generated, a layout design process is carried out, followed by a chip design process.

Tools used to carry out the synthesis in each of the above synthesis phases are actually software-implemented. Since the tools are software-implemented, they are necessarily subject to bugs, and it is necessary to verify whether the synthesis in each of the above synthesis phases has been correct or not.

The logic synthesis phase has been performed relatively frequently, and hence the verification of the logic synthesis phase (logic verification) has also been performed frequently in order to prove the logic synthesis. However, the behavioral synthesis process has not been verified as much as the logic verification because it has often been replaced with a manual synthesis process.

To meet demands in recent years for LSI circuits which are more highly integrated and larger in scale, LSI circuits to be manufactured contain several million gates, which pose higher requirements for behavioral synthesis. In this connection, the verification of the behavioral synthesis phase is a very important task to be studied.

The conventionally most general form of the verification of the behavioral synthesis phase has been a simulation performed using a given test pattern. However, the simulation has suffered the following problems:

To carry out a simulation using a test pattern, the test pattern needs to be generated of necessity, and the generation of the test pattern is time-consuming and costly. The contents of a synthesis that can be verified by the simulation depend on the test pattern, and errors not considered by the test pattern that is used cannot be subject to the verification. Consequently, the conventional simulation-based verifying process may possibly produce unsatisfactory results.

Another process of verifying an RTL description generated from a behavioral description in the behavioral synthesis phase is carried out by verifying the equivalence between the RTL description and the behavioral description.

For example, an apparatus for verifying a behavioral synthesis is described in "Formal Methods in System Design", Vol. 16, pp. 59–91, 2000 (document 1). The apparatus described in the document 1 outputs 1) a type specification description, 2) correctness lemmas, and 3) a verification script for a theorem proving system called PVS, from a behavioral description, an RTL description, and an associated relation which is a by-product of the behavioral synthesis. The correctness lemmas represent a logic formula which extracts an execution path (a series of states) for each basic block that does not contain a branch/confluence structure of a behavioral description and an RTL description, and when an associated relation of execution paths and an associated relation of signals are given, indicates that changes in signal values corresponding to the respective paths are the same. The theorem proving system PVS generates a function representing changes in signal values at the time the paths are executed, according to a verification script using a term rewriting system. It is checked if functions indicating changes in a corresponding signal pair in corresponding paths are equivalent. If functions indicating changes in pairs of all corresponding paths and pairs of all corresponding signal values are equivalent, then the behavioral description and the RTL description are equivalent to each other.

Another apparatus for verifying a behavioral synthesis is described in "International Conference on Computer Design", pp. 458–466, 1999 (document 2). The apparatus described in the document 2 is the same as the apparatus described in the document 1 in that it extracts an execution path, and when an associated relation of execution paths and an associated relation of signals are given, it generates functions indicating changes in signal values at the time respective paths are executed, and checks if functions for corresponding signals in corresponding paths are equivalent. In the apparatus described in the document 2, however, extracted execution paths are not limited to basic blocks. The apparatus extracts execution paths while developing a repetitive structure (looped structure) of an original behavioral description until an execution path corresponding to the RTL description is found. Functions indicative of changes in signal values are generated using a technique called a symbol simulation, rather than the term rewriting system.

The conventional verifying apparatus disclosed in the documents 1 and 2 have the following problems:

The first problem is that they do not handle the verification of complete equivalence between a behavioral description and an RTL description for the reason that the steps carried out in the behavioral synthesis process are limited to only scheduling and binding. Generally, the behavioral synthesis process carries out not only these steps, but also a preprocessing step for converting a received behavioral description into a form suitable for subsequent steps and a postprocessing step for converting a description subjected to binding into an RTL description capable of being logically synthesized. However, since there is a large separation of abstractness between a behavioral description and an RTL description, it is difficult to verify, at one time, complete equivalence between a behavioral description and an RTL description including those steps.

The second problem is that the verification is time-consuming for the following reason: According to the above documents 1, 2, when a description includes a control structure, paths (execution series) free of confluences are extracted, and changes in signal values in the respective paths are extracted and compared. Since the number of execution series increases exponentially depending on the number of branch/confluence structures, if the control structure is complex, then the number of paths increases, and the number of symbol simulations and the number of times that function values are compared also increase, resulting in a longer time required for the verification.

SUMMARY OF THE INVENTION

It is an object of the present invention to provide a verifying tool for verifying a synthesis in a behavioral synthesis phase in a short period of time at a low cost and automatically producing satisfactory verified results.

The inventor of the present invention has studied a processing sequence performed in a behavioral synthesis in order to achieve the above object.

Generally, a behavioral synthesis device derives an RTL description from a behavioral description by accumulating modifications of descriptions in small steps. Specifically, in a preprocessing step, the behavioral synthesis device modifies a behavioral description into a form suitable for a subsequent step by expanding a function call, modifies a behavioral description by deleting an unused code, and modifies a behavioral description by optimizing a language level. Then, in response to the preprocessed description, the behavioral synthesis device performs a scheduling step to determine which operation/calculation is to be executed in which step (or stage). Thereafter, in response to the scheduled description, the behavioral synthesis device carries out a register binding step to generate a register for holding a value, share the register for minimizing the cost, assign the resister to a variable. The behavioral synthesis device performs an arithmetic unit mapping (also arithmetic unit binding) step to assign arithmetic units to operators in a description to optimize the number of arithmetic units. The behavioral synthesis device then performs a postprocessing step to convert the bound description into a logically synthesizable RTL description. When each of these steps is finished, the behavioral synthesis device outputs an intermediate level description.

The present invention is characterized by outputting intermediate level descriptions subsequent to the respective steps and verifying the equivalence between the intermediate level descriptions in close association with the behavioral synthesis device. The separation of abstractness between intermediate level descriptions is smaller than the separation of abstractness between a behavioral description and an RTL description which are an input and an output, respectively, of the behavioral synthesis device, and the steps carried out between the intermediate level descriptions are clearly known, thus allowing the equivalence between the intermediate level descriptions to be verified with ease. By verifying the equivalence between the intermediate level descriptions from all the steps of the behavioral synthesis, the full equivalence between the behavioral description and the RTL description can be verified.

The behavioral synthesis device is controlled to output an associated relation between intermediate level descriptions. In each of the steps of the behavioral synthesis, the description is modified. When a behavioral description and an RTL description are to be directly compared with each other, since it is impossible to automatically recognize an associated relation, i.e., which description has been replaced with which description, what variable has been replaced with what register, the verification of the equivalence between the descriptions is semiautomatic, requiring interactive operations on the part of the designer. According to the present invention, the above information is outputted from a behavioral synthesis system to automatically verify the equivalence between a behavioral description and an RTL description.

According to the present invention, the equivalence between descriptions prior and subsequent to each of the steps is verified by extracting a model capable of expressing a control structure based on a finite state machine and an update of a signal value from each of the descriptions, performing a symbolic simulation on the model to expressing the update of a signal value with a function, and verifying the equivalence between updating functions of corresponding signal values. The model is extracted by carrying out the conversion into a model such that two transitions are necessarily injected into a confluence state, and the symbolic simulation is performed by expressing the update of a signal value subsequent to a confluence with a function using an expression of if-then-else when the confluence state is reached. Thus, a branch/confluence structure in the control structure of a description can easily be handled by the symbolic simulation, and the procedure of the symbolic simulation applicable to the confluence structure in the model is realized. Therefore, even if the control structure is complex, not all execution paths need to be extracted, and the time required for verification can be reduced.

The present invention offers the following advantages:

The first advantage is that the full equivalence between a behavioral description and an RTL description can be verified. The reason for the full equivalence is that the verification of the equivalence between a behavioral description and an RTL description is resolved into an easier task, i.e., the verification of the equivalence between descriptions prior and subsequent to each step, i.e., intermediate level descriptions of each step which are output from the behavioral synthesis device.

The second advantage is that the time required to verify the equivalence can be shortened. The reason for the shortened verification time is that a model suitable for a symbolic simulation is devised and a procedure of the symbolic simulation for handling a confluence structure is devised.

The above and other objects, features, and advantages of the present invention will become apparent from the following description with reference to the accompanying drawings which illustrate examples of the present invention.

BRIEF DESCRIPTION OF THE DRAWINGS

FIG. 2 is a diagram showing a behavioral description by way of example in the embodiment of the present invention;

FIG. 3 is a diagram showing an intermediate level description by way of example in the embodiment of the present invention;

FIG. 4 is a diagram showing another intermediate level description by way of example in the embodiment of the present invention;

FIG. 7 is a diagram showing an associated relation way of example in the embodiment of the present invention;

FIG. 14 is a diagram showing a symbol simulation of a normal transition by way of example in the embodiment of the present invention;

FIG. 15 is a diagram showing a symbol simulation of a branch transition by way of example in the embodiment of the present invention;

FIG. 16 is a diagram showing, by way of example, a symbol simulation of a confluence transition which is injected into a confluence state mutually linked to a branch state illustrated in the embodiment of the present invention;

DETAILED DESCRIPTION OF THE PREFERRED EMBODIMENTS

Figure 1:
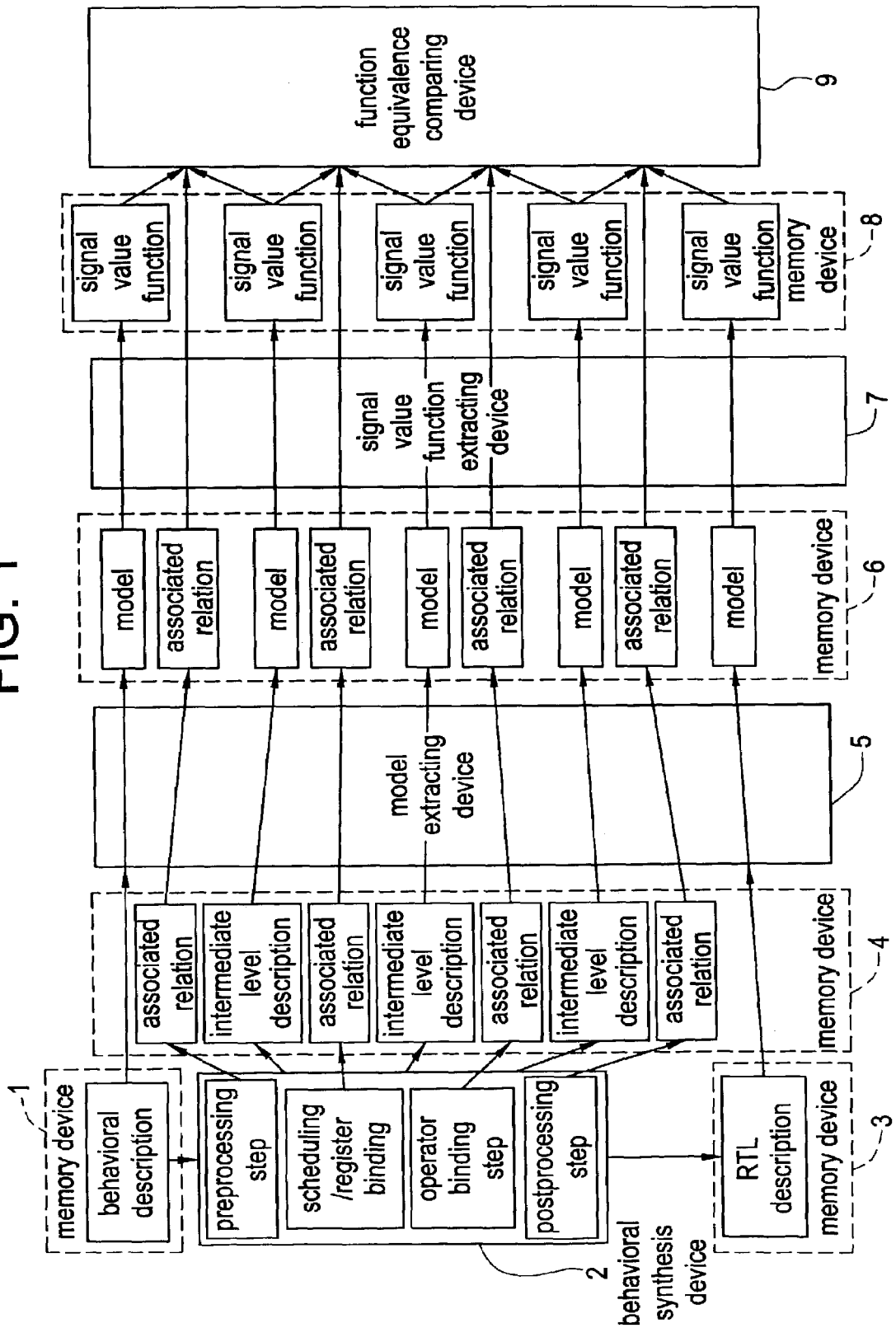
FIG. 1 is a block diagram of a system according to an embodiment of the present invention.

As shown in FIG. 1, a system according to an embodiment of the present invention, as a logic circuit equivalence verifying apparatus, comprises memory device 1 for storing behavioral descriptions, behavioral synthesis device 2, memory device 3 for storing RTL descriptions, memory device 4 for storing intermediate level descriptions and associated relations of a behavioral synthesis phase, model extracting device 5, memory device 6 for storing models and associated relations, signal value function extracting device 7 for extracting signal value functions, memory device 8 for storing signal value functions, and function equivalence comparing device 9 for comparing the equivalence of signal value functions. The system can be implemented by a computer such as a personal computer, a work station, or the like and an equivalence verifying program. The equivalence verifying program is recorded on a computer-readable recording medium such as a magnetic disk or the like, which is provided to the user. When the equivalence verifying program is into the computer, it controls the computer to realize functional means corresponding to model extracting device 5, signal value function extracting device 7, and function equivalence comparing device 9.

FIG. 2 shows a behavioral description by way of example. Such a behavioral description is generated using a language like the C language, for example. Memory device 1 stores the generated behavioral description in advance.

Behavioral synthesis device 2 is a device which is supplied with a behavioral description as an input, outputs intermediate level descriptions and associated relations during its processing operation, and finally outputs an RTL description. The RTL description which is output from behavioral synthesis device 2 is stored in memory device 3. Intermediate level descriptions are descriptions produced during a synthesis process and output after respective steps of behavioral synthesis device 2 are finished. Intermediate level descriptions are output from behavioral synthesis device 2 and stored in memory device 4. Intermediate level descriptions are output using a language like the C language, for example. FIGS. 3 and 4 show intermediate level descriptions, respectively. Specifically, FIG. 3 shows an intermediate level description after a preprocessing step, and FIG. 4 shows an intermediate level description after a postprocessing step. In FIGS. 3 and 4, a signal declared "input" represents an input signal, a signal declared "output" an output signal, a signal declared "variable" an ordinary signal, a signal declared "terminal" an ordinary wiring signal, and a signal declared "register" a signal serving as a register. Other signals are in accordance with the rules of the C language. An associated relation represents associated information between a description to be converted and a description that is converted by a description converting process that is carried out in the internal steps of behavioral synthesis device 2. The associated relation is output from behavioral synthesis device 2 and stored in memory device 4.

Model extracting device 5 is a device for extracting a model capable of expressing a control structure based on a finite state machine and an update of a signal, from a behavioral description, intermediate level descriptions, and an RTL description. The model capable of expressing a control structure based on a finite state machine and an update of a signal comprises, for example, an EFSM (Extended Finite State Machine) model. The EFSM model is a form of expressing a complete sequential machine comprising a set S of states, a set I of p-dimensional input values $I = I1 \times I2 \times I3 \times \ldots \times Ip$, a set O of q-dimensional output values $O = O1 \times O2 \times O3 \times \ldots \times Oq$, a set D of n-dimensional signal values $D = D1 \times D2 \times D3 \times \ldots \times Dn$, a set F of transition condition functions $F = \{f1, f2, \ldots\}$, a set U of signal value updating functions $U = \{u1, u2, \ldots\}$, and a set T of transition relations.

The transition condition function fi is a function $(D \times I \rightarrow \{0, 1\})$ for converting a set D of signal values and a set I of input values into a true/false value.

The signal value updating function ui is a function $(D \times I \rightarrow D \times O)$ for converting a set D of signal values and a set I of input values into a set D of signal values and a set O of output values.

The transition relation is a function $(S \times F \rightarrow S \times U)$ for converting a set F of transition condition functions and a set S of states into a set U of signal value updating functions.

The EFSM model is expressed using a directed graph. A vertex of the directed graph corresponds to a state, and a branch of the directed graph corresponds to a transition. To a transition, there are attached a transition condition and a signal value updating function thereof as a label f/u.

Input values, output values, and signal values of an EFSM model have respective inherent names, and can be referred to under their names. These names correspond input port names, output port names, and signal names (variables and registers) of same names, of a behavioral description, an RTL description, and intermediate level descriptions.

The states of an EFSM model are divided into several groups called blocks. States belonging to one block are interconnected by transitions. A state in which no transition is injected from any states in a block is referred to as a block start state, and a state in which a transition is ejected to a state out of a block is referred to as a block end state.

Figure 5:
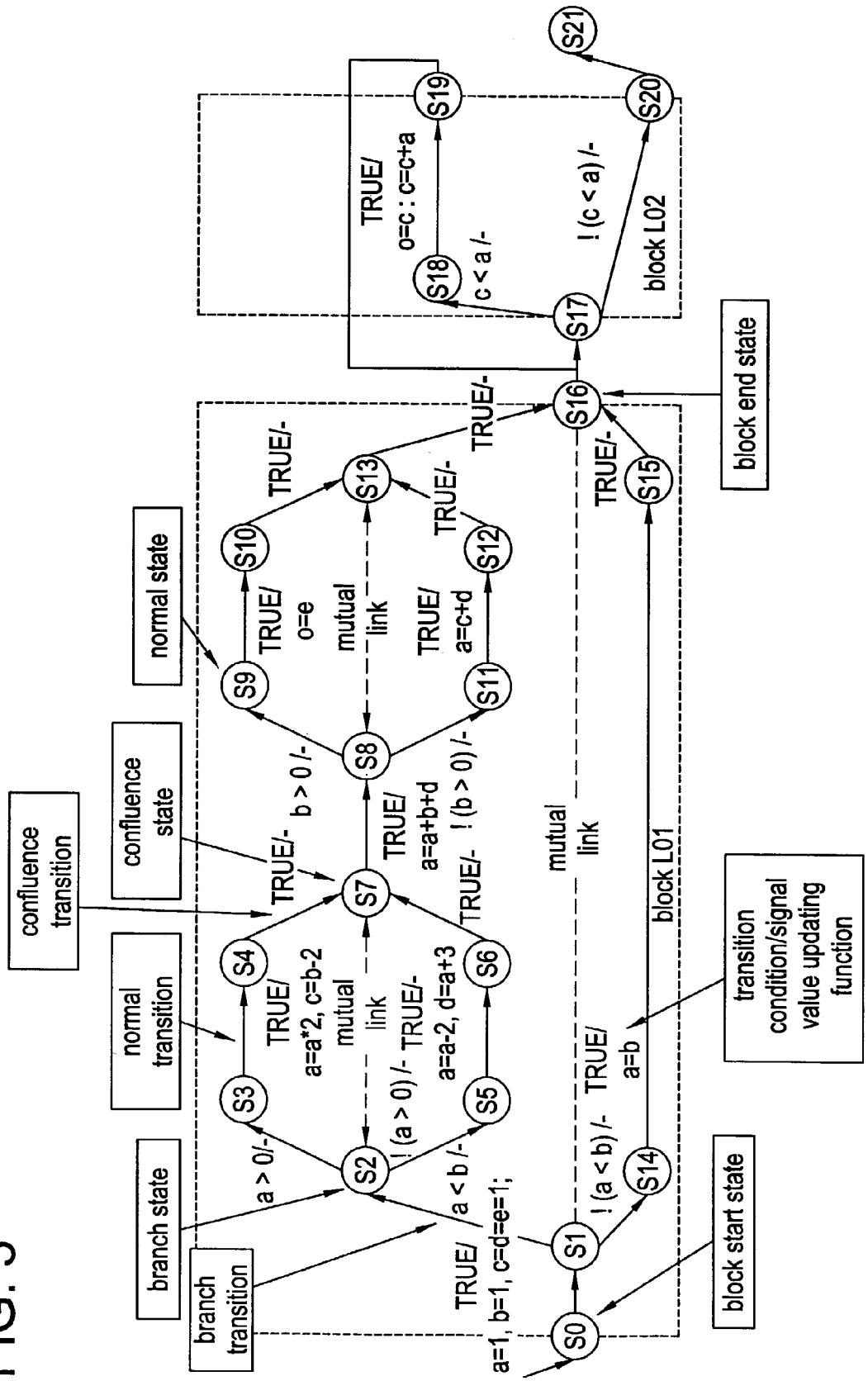
FIG. 5 is a diagram showing an EFSM model by way of example in the embodiment of the present invention.
Figure 6:
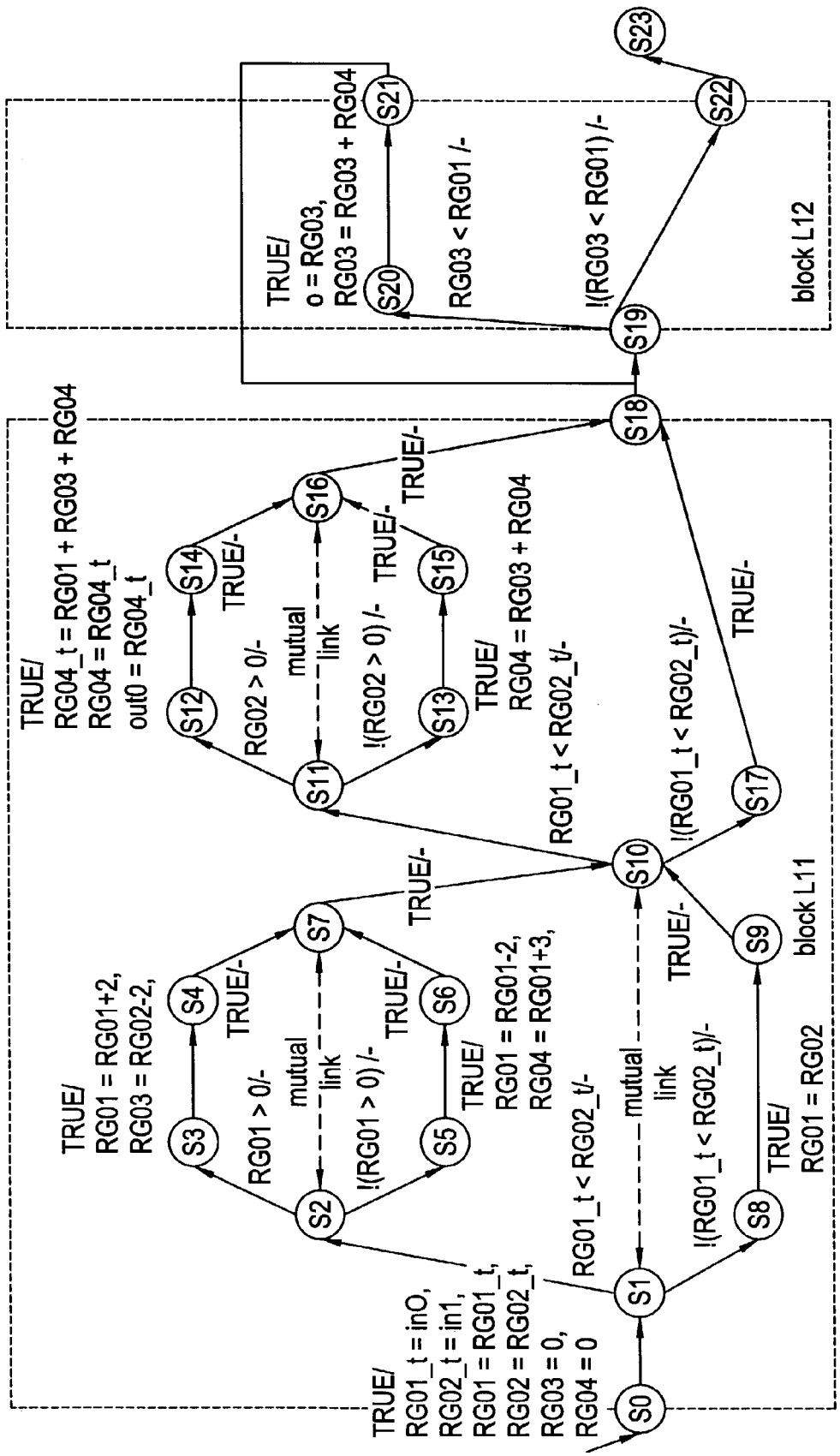
FIG. 6 is a diagram showing another EFSM model by way of example in the embodiment of the present invention.

FIGS. 5 and 6 show EFSM models, respectively. The EFSM model shown in FIG. 5 is converted from the intermediate level description shown in FIG. 3. The EFSM model shown in FIG. 6 is converted from the intermediate level description shown in FIG. 4. In FIGS. 5 and 6, states and transitions are expressed by graphs. A vertex of a graph represents a state and is accompanied by the name of the state. A branch of a graph represents a transition and is accompanied by a transition condition and a signal value updating function. A block is expressed by a broken-line rectangular form.

The states of an EFSM handled by the present invention include a branch state, a confluence state, and an normal state, which are all exclusive. The branch state is a state from which two transitions are ejected. The confluence state is a state into which two transitions are injected. The normal state is a state into which one transition is injected and a state from which one transition is ejected.

The transitions of an EFSM handled by the present invention include a normal transition, a branch transition, and a confluence transition, which are all exclusive. The branch transition is a transition which is ejected from a branch state. The confluence transition is a transition which is injected into a confluence state. The branch transition and the confluence transition do not change a signal value, and do not output anything.

An EFSM handled by the present invention has certain limitations about the division of blocks. First, each block should not contain a directed loop.

This does not mean that a description having a directed loop is not subject of this method. If a description having a repetitive structure is divided into a block up to the start of the repetition, a block of the repetition, and a block following the end of the repetition, then each of the blocks has no repetitive structure.

Another limitation is that at most two transitions are ejected from any state and at most two transitions are injected into a state other than a block start state. If there are confluences from three or more three states in an original description, then they are divided by newly generated confluence states and confluence transitions. This limitation makes it possible to handle a control structure having confluences in a symbolic simulation to be described later on.

Finally, each block should have only one block start state, and only one interblock transition should be present between any two blocks.

Signal value function extracting device 7 is a device for extracting a signal value function from a model. The signal value function is a function representing changes in a signal value, and is expressed by an arbitrary variable and an arbitrary arithmetic operation. The signal value function is stored in memory device 8.

Function equivalence comparing device 9 is a device for comparing two functions that are input thereto and determining whether the two functions are equivalent or not.

Operation of the system according to the embodiment of the present invention will be described below with reference to the drawings.

Behavioral synthesis device 2 automatically converts a behavioral description into an RTL description.

Behavioral synthesis is carried out using a known process described in "IEEE Transactions on Computer Aided Design of Integrated Circuits and Systems", Vol. 19, No. 11, pp. 1507–1522, 2000, for example.

In behavioral synthesis device 2, a description is modified successively in steps, and an intermediate level description is produced when each of the steps is finished.

Behavioral synthesis device 2 shown in FIG. 1 outputs an intermediate level description after each of "preprocessing step", "scheduling/register binding step", "operator binding step", and "postprocessing step".

Behavioral synthesis device 2 has information as to which signal in an intermediate level description prior to a step is converted by the step into which signal in an intermediate level description subsequent to the step. Behavioral synthesis device 2 also has information as to which description group in an intermediate level description prior to a step is converted by the step into which description group in an intermediate level description subsequent to the step. Behavioral synthesis device 2 outputs these items of information as an associated relation. FIG. 7 shows an associated relation by way of example. The associated relation shown in FIG. 7 indicates that description groups starting with respective labels L11, L12 in the intermediate level description shown in FIG. 4 correspond respectively to description groups starting with respective labels L01, L02 in the intermediate level description shown in FIG. 3. FIG. 7 also shows an associated relation between signals at the starting times of the description groups. For example, FIG. 7 indicates that signal i1 at the time of label L01 corresponds to a signal in0 at the time of label L11. Other associated signals are similarly indicated in FIG. 7.

Figure 8:
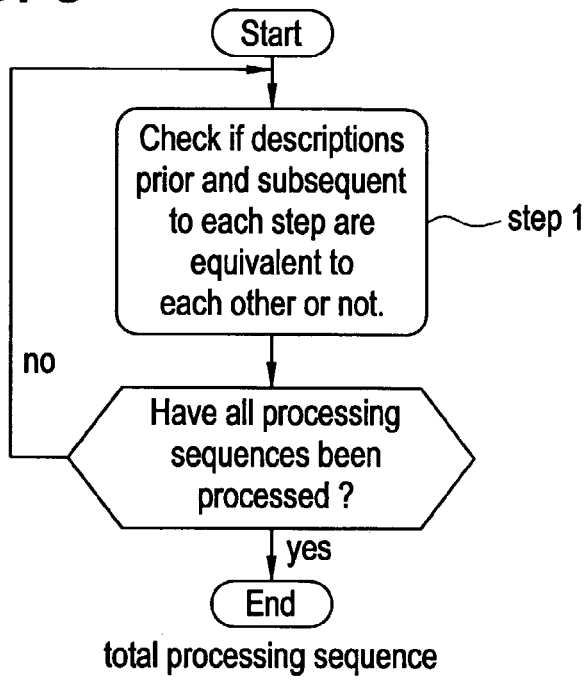
FIG. 8 is a flowchart of a processing sequence of the system according to the embodiment of the present invention.

The logic circuit equivalence verifying apparatus repeats step 1 in a processing sequence shown in FIG. 8 to check if intermediate level descriptions prior and subsequent to each step are equivalent to each other or not. However, a description prior to the first step comprises a behavioral description which is an input to behavioral synthesis device 2, and a description subsequent to the final step comprises an RTL description which is an output from behavioral synthesis device 2. These descriptions will hereinafter be referred to uniformly as intermediate level descriptions. An intermediate level description prior to a step, which is to be verified, will be referred to as intermediate level description H, and an intermediate level description subsequent to the step, which is to be verified, will be referred to as intermediate level description L.

Figure 9:
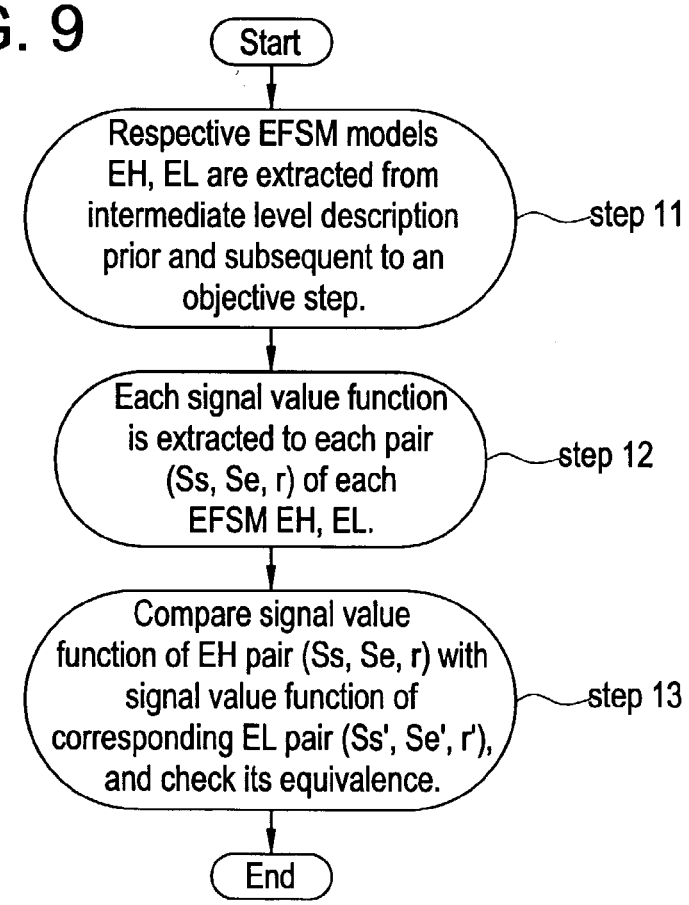
FIG. 9 is a flowchart of a processing sequence of step 1 shown in FIG. 8.

FIG. 9 shows in detail a processing sequence of step 1 shown in FIG. 8.

In step 11 shown in FIG. 9, respective EFSM models are extracted from intermediate level description H and intermediate level description L. A detailed procedure of step 11 will be described below.

It is assumed that all sentences in an intermediate level description are resolved and expressed as a "assignment sentence" which defines a substitute in a signal, a "conditional branch sentence" (if sentence) which expresses a control structure based on a conditional branch, and an "unconditional branch sentence" (goto sentence or label sentence) which expresses a control structure based on an unconditional branch. All other sentence structures are to read as one of the above sentences, and hence do not lose generality.

The sentences are converted into an EFSM according to the type thereof in a downward sequence which is the order to execute the description, as follows:

A normal transition is generated with respect to a assignment sentence. A signal value updating function of the normal transition is defined from the contents of the assignment sentence according to a substitute definition formula for assignment sentences.

Figure 10:
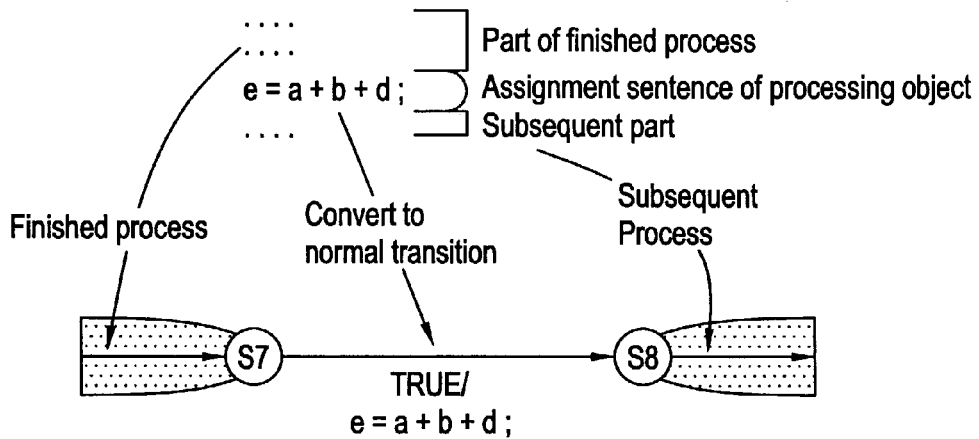
FIG. 10 is a diagram showing a processing of a assignment sentence by way of example in the embodiment of the present invention.

FIG. 10 shows a process of converting a assignment sentence into an EFSM, by way of example. In the illustrated example, the conversion process has been finished up to a sentence prior to a assignment sentence "e=a+b+d". The state at this time is represented by S7. Then, the assignment sentence is processed. A normal transition is generated with respect to the assignment sentence, with a transition condition being indicated by TRUE and a signal value updating function by "e=a+b+d". The state subsequent to the transition is represented by S8. Subsequently, sentences following the assignment sentence are converted.

A branch state, a confluence state, a branch transition, and a confluence transition are generated with respect to a conditional branch sentence. A sentence in the branch is processed recursively. However, if no control goes to sentences following the if sentence, then a confluence state and a confluence transition are not generated. When a confluence state is generated, the branch state and the confluence state may be mutually linked to each other, thus allowing the corresponding branch state or confluence state to be recognized. This is determined by a transition series from the branch state to the confluence state, e.g., by determining that there is no confluence state free of a mutual link in the transition series from the branch state to the confluence state. As described above, no signal value is updated in branch transitions and confluence transitions. That is, a signal value updating function is defined to save signal values.

Figure 11:
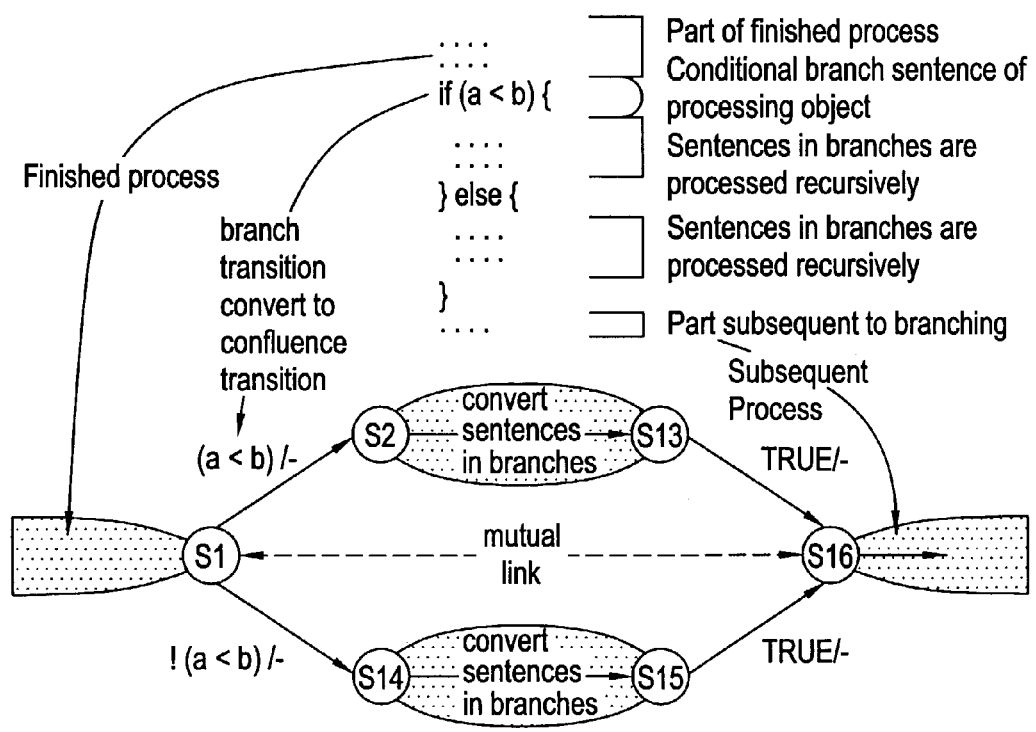
FIG. 11 is a diagram showing a processing of a conditional branch sentence by way of example in the embodiment of the present invention.

FIG. 11 shows a process of converting a conditional branch sentence to an EFSM by way of example. In the illustrated example, the conversion process has been finished up to a sentence prior to a conditional branch sentence "if (a>b){ . . . } else { . . . }". The state at this time is represented by S1. Then, the conditional branch sentence is processed. A branch state and a branch transition are generated with respect to the conditional branch sentence. A transition condition of the branch transition if the condition is satisfied is represented by "a>b" and the signal value is not updated. A transition condition of the branch transition if the condition is not satisfied is represented by "! (a>b)" and the signal value is not updated.

The states subsequent to the branch transitions are represented by S2, S14, respectively. Sentences in the branches if the condition is satisfied and not satisfied are processed recursively. The states subsequent to the conversion are represented by S13, S15, respectively. Thereafter, confluence transitions are generated. Transition conditions of the confluence transitions are represented by TRUE, and the signal value is not updated. The state after the confluence is represented by S16. Thereafter, sentences subsequent to the conditional branch sentence are converted.

A confluence state and a confluence transition are generated with respect to an unconditional branch sentence. At this time, there are two kinds of confluence methods depending on other transitions joined to the label of a destination.

If there is a pair of branches that are identical to the most recent branch (except for those mutually linked to the confluence state) among the other transitions joined to the label of a destination, then a confluence state and a confluence transition are generated with respect to the pair. At this time, the branch state and the confluence state are mutually linked to each other.

If such a pair is not produced, then those branches whose histories are similar to each other are paired, generating a confluence state. Those branches whose histories are similar to each other mean branches whose initial partial series of histories are identical to each other. At this time, since a branch state cannot be identified, no mutual link is formed between a branch state and the confluence state.

The above process is repeated to join branches while ensuring that there are always two transitions injected into a confluence state with respect to a plurality of goto sentences transited to one label.

As with the conditional branch sentence, no signal value is updated in branch transitions and confluence transitions (a signal value updating function is defined to save signal values).

Figure 12:
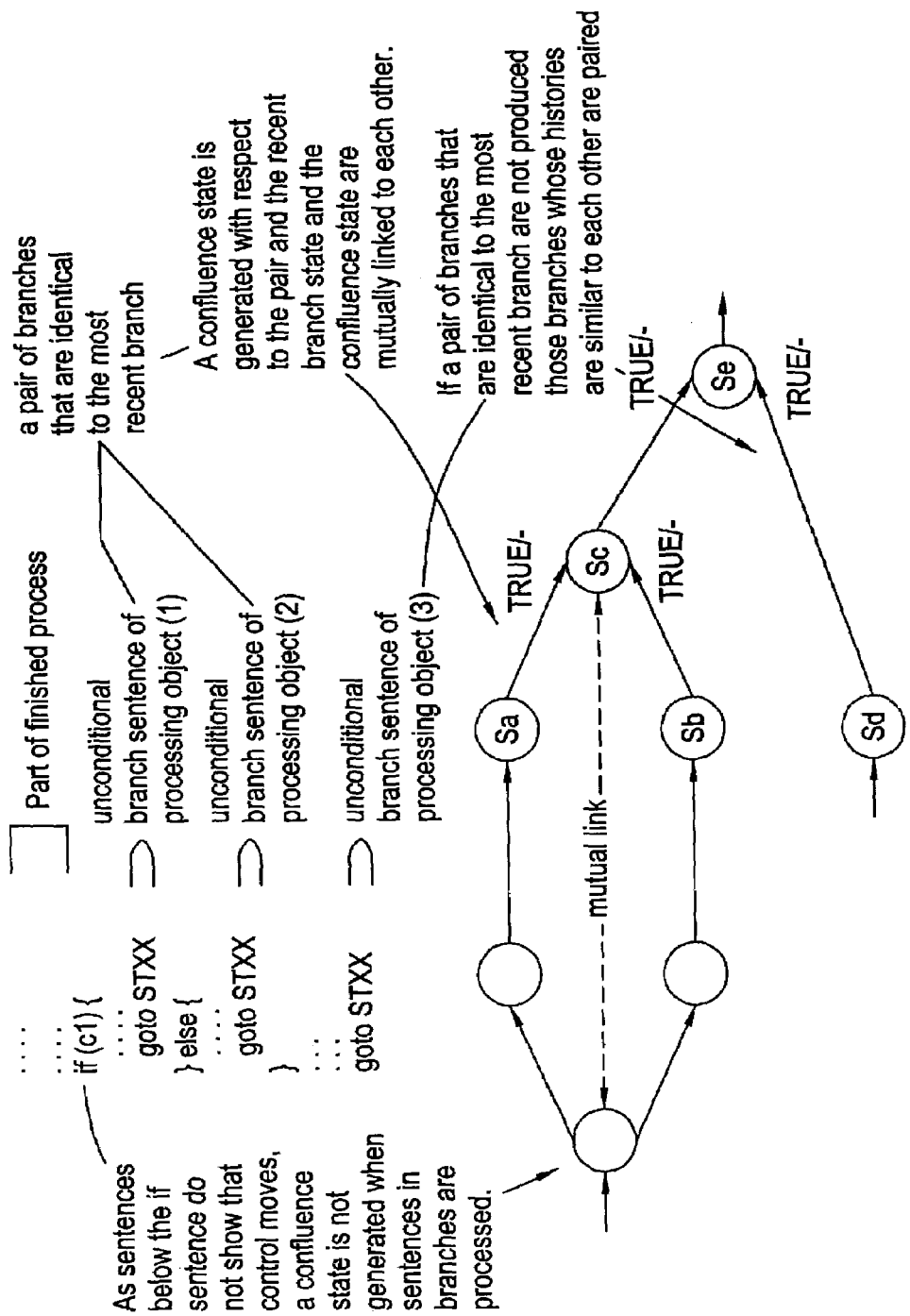
FIG. 12 is a diagram showing a processing of an unconditional branch sentence by way of example in the embodiment of the present invention.

FIG. 12 shows a process of converting an unconditional branch sentence into an EFSM. The illustrated example contains three unconditional branch sentences "goto STXX" which have the same branch destination. The conversion process has been finished up to a sentence prior to each of the unconditional branch sentences, and their states are represented by Sa, Sb, Sd, respectively. Of the three unconditional branch sentences, the unconditional branch sentences (1) and (2) are paired as their most recent branches are identical to each other. Therefore, a confluence transition is generated for these unconditional branch sentences. Transition conditions of the confluence transitions are represented by TRUE, and the signal value is not updated. The state after the confluence is represented by Sc. The confluence transitions are mutually linked to the most recent branch. Since no more pair of unconditional branch sentences whose most recent branches are identical to each other is produced, the state Sc after the confluence and the unconditional branch sentence (3) are paired. A confluence transition is generated with respect to the pair. A transition condition of the confluence transition is represented by TRUE, and the signal value is not updated. The state after the confluence is represented by Se.

Since a branch state cannot be identified, no mutual link is formed to a branch state.

At a level close to the RTL, it may have occasionally been specified to simultaneously execute a plurality of successive sentences. In such a case, a register and internal terminals may explicitly be indicated, the timing of updating a signal value may explicitly be indicated (corresponding to a clock boundary), or the depending relation for updating may not be directed downwardly. When this is the case, the updating relation for a signal (register value) in one state is extracted using a term rewriting system, and a normal transition is generated by a signal value updating function thus obtained.

EFSM models thus produced according to the above process are referred to as EH and EL. The EH represents an EFSM model corresponding to the intermediate level description H and the EL represents an EFSM model corresponding to the intermediate level description L.

As described above, behavioral synthesis device 2 indicates description groups in an intermediate level description according to an associated relation. Information about the division of the blocks of the EFSM EH, EL is produced based on the information of the description groups. However, it is not necessary to divide the blocks according to the respective description groups, but it is possible to collect several processing units satisfying the limitations of the EFSM model into one block. Block start and end states of the EFSM EH, EL are indicated by the above information.

When the block start and end states are indicated, an associated relation between the block start and end states is further indicated from the associated relation stored in memory device 4. The obtained associated relation is stored in memory device 6.

FIG. 5, which illustrates an EFSM converted from the intermediate level description shown in FIG. 3, shows the manner in which the EFSM is converted into two blocks L01, L02.

Similarly, FIG. 6, which illustrates an EFSM converted from the intermediate level description shown in FIG. 4, shows the manner in which the EFSM is converted into two blocks L11, L12.

Based on the associated relation of description groups output from behavioral synthesis device 2, a pair (associated relation) of block start state Ss of EH and block start state Ss' of EL and a pair (associated relation) of block end state Se of EH and block end state of EL are indicated.

A pair (associated relation) of signal r of EH and signal r' of EL is indicated from the associated relation of signals. The associated relation may not be given for all signals of the EFSM EH. Those signals for which no associated relation is given will not be compared for signal function comparison to be described later on.

Figure 18:
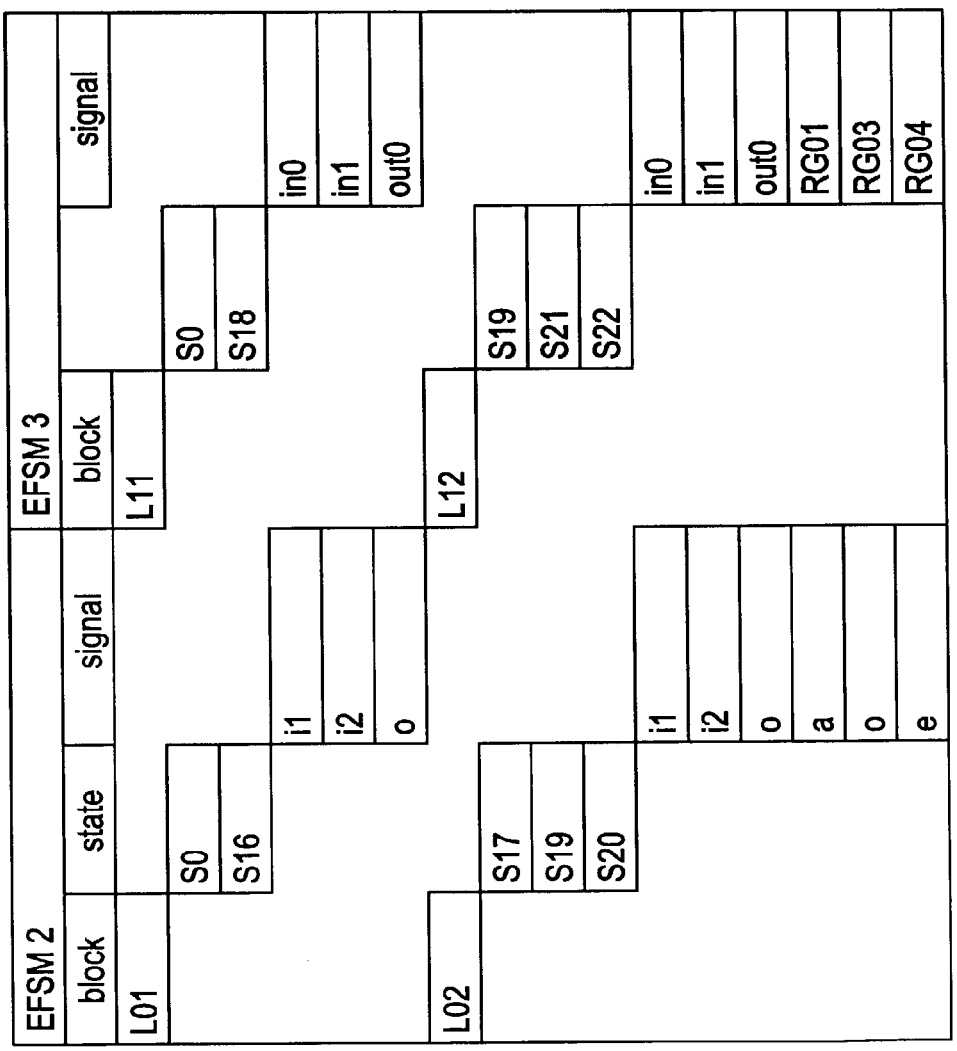
FIG. 18 is a diagram showing an associated relation way of example in the embodiment of the present invention.

FIG. 18 shows an associated relation way of example. From the associated relation of blocks, states S0 S16 in block L1 of EFSM 2 correspond respectively to states S0, S18 in block L11 of EFSM 3. In these blocks, i1 corresponds to in0, i2 to in1, and o to out0.

In step 12, signal value updating function V(Ss,Se)(x) and transition condition function C(Ss,Se)(x) are generated for each pair of start state Ss, end state Se, and signal R of each block from both EFSM models EH, EL. The signal value updating function is a function indicative of changes in the signal value when the transition is executed from start state Ss to end state Se, with vector x of the signal value at start state Ss. The transition condition function is a function indicative of a condition for executing the transition from start state Ss to end state Se, with vector x of the signal value at start state Ss.

Figure 13:
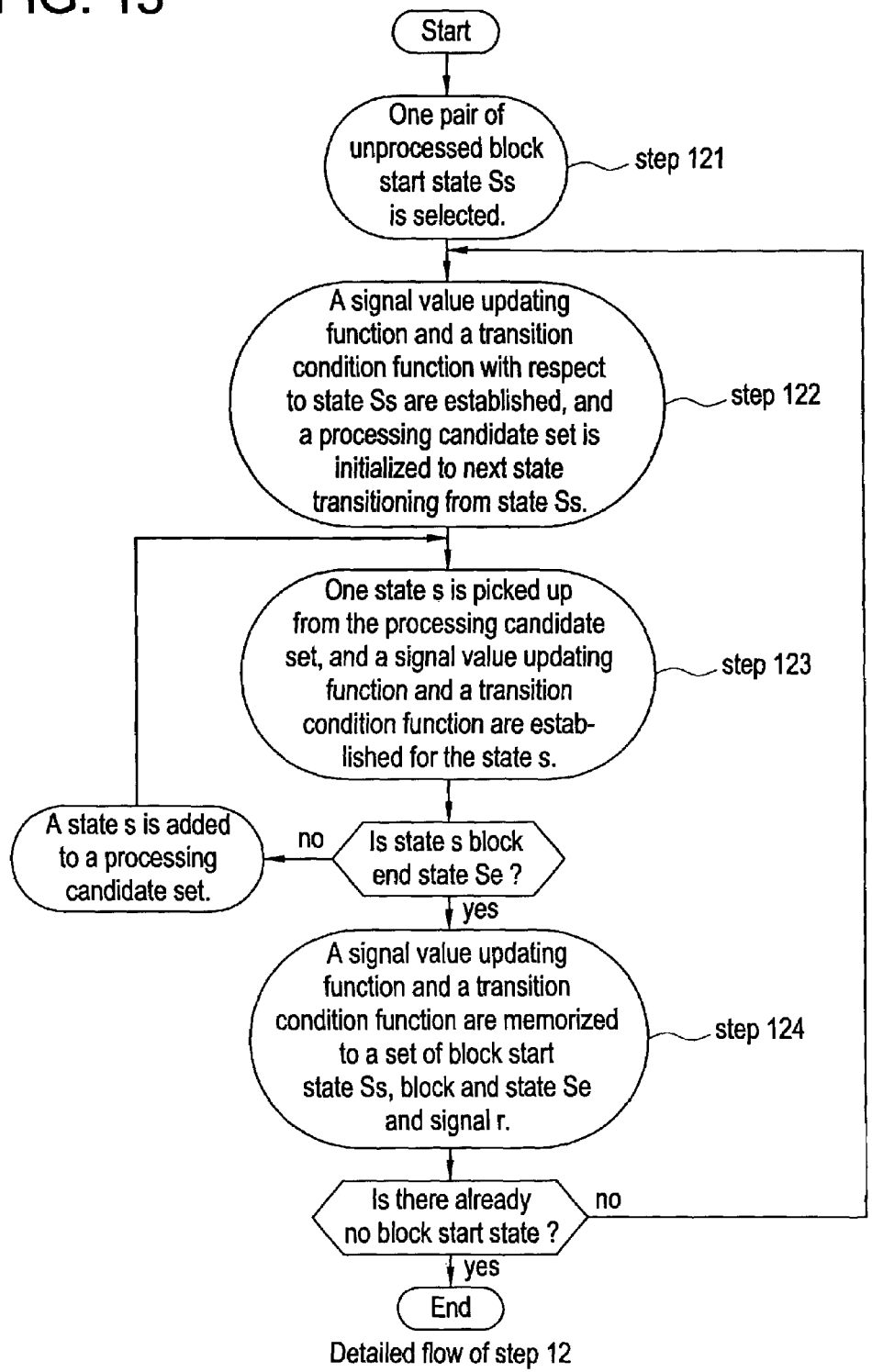
FIG. 13 is a flowchart of a processing sequence of step 12 shown in FIG. 5.

FIG. 13 shows a detailed process of step 12. In this process, signal value updating function V(Ss,S)(x) indicative of changes in the signal value when the transition is executed from start state Ss to reach state s, with vector x of the signal value at start state Ss, and transition condition function C(Ss,S)(x) which is a condition for the block to reach state s from start state Ss, are successively determined with respect to each state of the EFSM.

In step 121, one unprocessed block is selected from the EFSM.

In step 122, a signal value updating function and a transition condition function with respect to start state Ss of the block are established as follows:

V(Ss,Ss)(x)=x

C(Ss,Ss)=TRUE

A state that can be reached from Ss in one transition is added to a processing candidate set.

In step 123, one state s is picked up from the processing candidate set, and a signal value updating function and a transition condition function are established for state s which has been picked up. These functions are determined in one of the following modes (a), (b), (c), (d) depending on the type of a transition injected into state s to be processed:

(a) When Injected Transition T is a Normal Transition:

The state of a source from which transition T is ejected is assumed to be s1. When a transition is made from state s1 and reaches state s, each signal value si updated according to signal value updating function U(t)(x) of transition T. Therefore, the signal value updating function at the time the transition reaches state s from the start state of the block is represented by a composite function of the signal value updating function up to state s1 and the signal value updating function of transition T.

If it is indicated to read the value of an input signal in signal value updating function U(t)(x), then not only the value of a signal to be substituted, but also the value of the input signal are updated using an expression according to a function in order to indicate that the value has been read. Specifically, when the value of input signal i is exp, the updated value is represented by inp(exp) using a function inp( ) which indicates that the input is read.

Since transition T is unconditionally executed from state s1 (the transition condition of transition T is TRUE), the transition condition function of state s1 is saved.

V(Ss,s)(x)=(U(t)○V(Ss,s1))(x)

C(Ss,s)(x)=C(Ss,S1)(x)

FIG. 14 shows a symbol simulation of a normal transition by way of example. In the illustrated example, block L01 of EFSM 2 shown in FIG. 5 is selected. V(S0,S0)(x), C(S0, S0)(x) are assigned to start state S0 of the block. On a normal transition from S0 to S1, the values of input signals i, j are read into a, b, and other signals are initialized with 1. Therefore, after the transition, the values of a, b become i, j, respectively, and the values of b, d, c become 1. Since the values have been read from input signals i, j, they are updated to inp(i), inp(j), respectively.

(b) When Injected Transition T is a Branch Transition:

The state of a source from which transition T is ejected is assumed to be s1. The signal value is not updated in transition T because of the limitations of the EFSM. Therefore, the signal value updating function up to state s1 is saved as the signal value updating function at the time the transition reaches state s from the start state of the block. Transition T is executed when transition condition C(t)(x) is established in state s1. Consequently, the transition condition function for the transition to reach state s is represented by the logical product of the transition condition function in state s1 and the transition condition of transition T.

V(Ss,s)(x)=V(Ss,s1)(x)

C(Ss,s)(x)=C(Ss,S1)(x)ÔC(t)(V(Ss,S1)(x))

FIG. 15 shows a symbol simulation of a branch transition by way of example. The transition condition of a branch transition from S1 to S2 is represented by (a<b). Therefore, the transition condition of the transition to state S2 is represented by the logical product (i<j) of a logic formula in which the transition condition of the transition is replaced with the value of a signal written in state S1, and the transition condition of the transition to state S1.

(c) When State s is a Confluence State, and Injected Transitions T1, T2 are Confluence Transitions, and Also When a Mutual Link is Established From Confluence State s to Branch State sd:

The states of sources from which transitions T1, T2 are ejected are assumed to be s1, s2, respectively. The signal values are not updated in transitions T1, T2 because of the limitations of the EFSM.

However, the signal value at the time the transition reaches state s from the start state of the block differs depending on which transition is followed to reach state s. This depends on the transition condition of the transition ejected from branch state sd.

It is assumed that the transition conditions of transitions Td1, Td2 ejected from branch state sd are represented by h, ¬h and transitions T1, T2 reach state s via respective transitions Td1, Td2. The signal value updating function of signal r at the time the transition reaches state s from the start state of the block is expressed as indicated below, using an expression based on ite (if-then-else). The value of (ite c a b) is a when c is true, and b when c is false. The value of (ite c a b) is expressed as a when a and b are the same as each other. The transition condition function for the transition to reach state s is represented by the logical sum of transition condition functions at respective states s1, s2 in the confluence source.

V(Ss,s)(x)=(ite h(V(Ss,sd)(x)), V(Ss,s1)(x), V(Ss,s2)(x))
C(Ss,s)(x)=C(Ss,s1)(x)vC(Ss,s2)(x)

FIG. 16 shows, by way of example, a symbol simulation of a confluence transition which is injected into a confluence state mutually linked to a branch state. A branch state mutually linked to confluence state S7 is represented by S2, and the transition conditions of branch states ejected from the branch state are represented by (a>0), !(a>0), respectively. Therefore, the signal value updating function in state S7 is expressed by an expression of ite using condition (a>0).

(d) When State s is a Confluence State, and Injected Transitions T1, T2 are Confluence Transitions, and Also When a Mutual Link is not Established From Confluence State s to Branch State sd:

The states of sources from which transitions T1, T2 are ejected are assumed to be s1, s2, respectively. The signal values are not updated in transitions T1, T2 because of the limitations of the EFSM.

However, the signal value at the time the transition reaches state s from the start state of the block differs depending on which transition is followed to reach state s. This depends on the transition condition functions at respective states s1, s2 in the confluence source.

The signal value updating function of signal r at the time the transition reaches state s from the start state of the block is expressed as indicated below, using an expression based on ite (if-then-else) and a variable dc representing an indefinite value. The transition condition function for the transition to reach state s is represented by the logical sum of transition condition functions at respective states s1, s2 in the confluence source.

V(Ss,s)(x)=(ite C(Ss,s1)(x), V(Ss,s1)(x), (ite C(Ss,s2)(x), V(Ss,s2)(x),dc))
C(Ss,s)(x)=C(Ss,s1)(x)vC(Ss,s2)(x)

When the final state of the block is reached, a set of start state Ss of the block, end state Se of the block, signal r, and signal value updating function V(Ss,Se)(x), and transition condition function C(Ss,Se)(x) are stored in the memory device, in step 124.

In step 13, the function equivalence comparing device checks if signal value updating functions are equivalent with respect to a set of a corresponding start state, a corresponding end state, and a corresponding signal.

Figure 17:
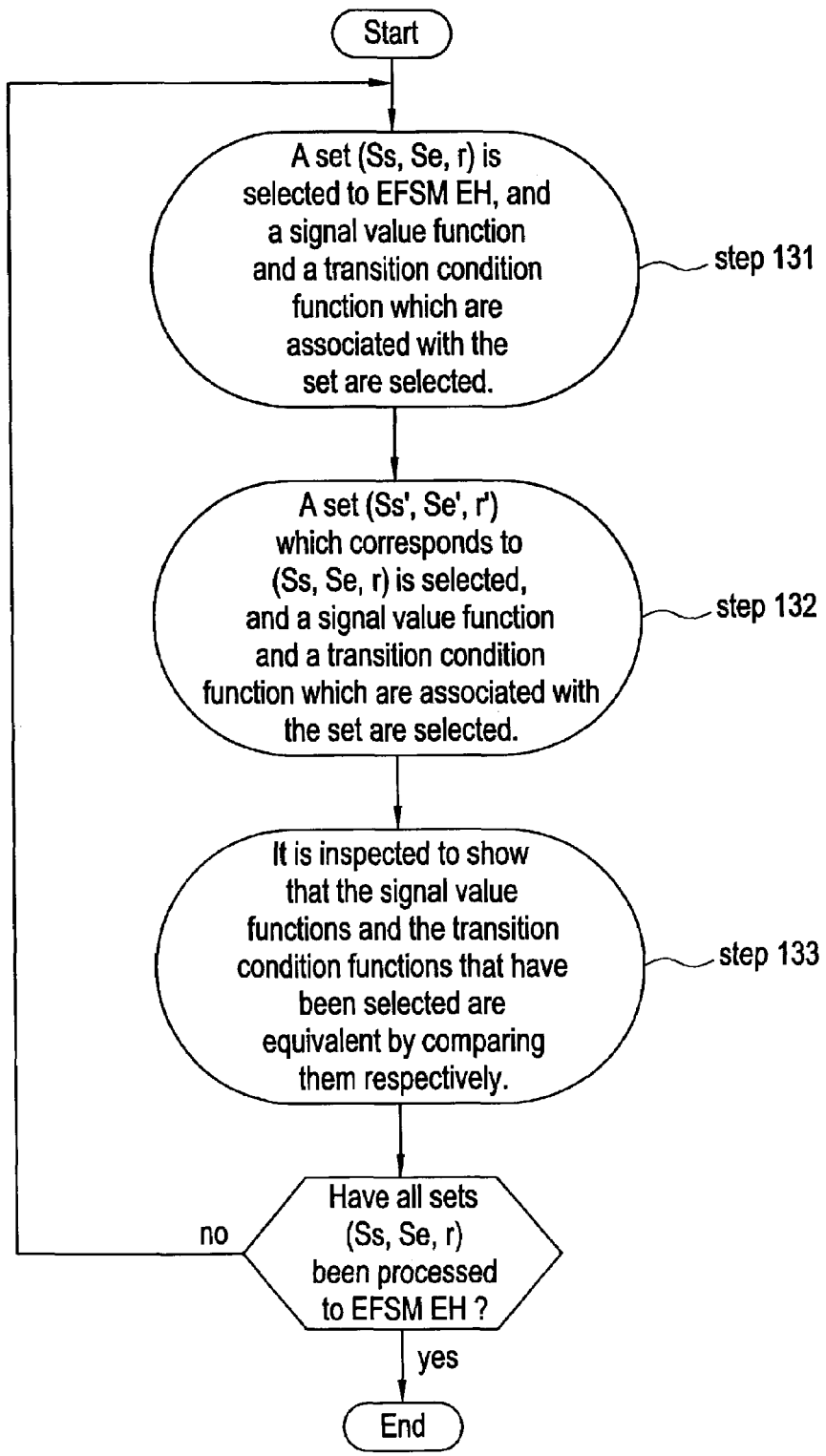
FIG. 17 is a flowchart of a processing sequence of step 13 shown in FIG. 5.

FIG. 17 shows a detailed process of step 13. In step 131, one signal r is selected from the names of signals to which block start state Ss, block end state Se, and an associated relation of the EFSM EH are given. A set (Ss, Se, r) is now indicated, and a signal value function and a transition condition function which are associated with the set are selected from memory device 8.

In step 132, a set (Ss', Se', r') of a block start state, a block end state, and a signal which correspond to (Ss, Se, r) is selected from the associated relation output from behavioral synthesis device 2, and a signal value function and a transition condition function which are associated with the set are selected from memory device 8.

In step 133, it is inspected to show that the signal value functions and the transition condition functions that have been selected are equivalent. The inspection employs a known technology described in Proceedings of International Conference on Computer Aided Design, pp. 2–6, 1995, for example.

The above process is repeated until sets of block start states Ss, block end states Se, and signals r of all EFSM models EH are compared.

Advantages of the embodiment of the present invention will be described below.

In the present embodiment, a comparison between a behavioral description and an RTL description is resolved as a comparison between several intermediate level descriptions, using intermediate level descriptions output from behavioral synthesis device, and an associated relation representing information of a process of description conversion based on a behavioral synthesis is used for comparing full equivalence between the behavioral description and the RTL description.

In an EFSM model converting process, the conversion into an EFSM model is carried out such that two transitions are necessarily injected into a confluence state. In a symbol simulation process, an expression based on ite is used to express an update of a signal value after a confluence at the time a confluence state is reached. Therefore, even if a control structure contains a branch or confluence structure, changes in the signal value can be expressed by a function without extracting all execution paths. Since execution paths do not need to be extracted, the number of times that a symbol simulation is carried out and the number of times that signal value updating functions are compared can be reduced, thus reducing the execution time required for verification.

A second embodiment of the present invention will be described in detail below.

The second embodiment of the present invention differs from the above embodiment of the present invention in that the behavioral synthesis device gives an associated relation of branch structures in addition to an associated relation of processing units and an associated relation of signals, and a logic verifying device uses the associated relations.

The behavioral synthesis device outputs a pair (b, b') of branches those branch conditions are equivalent to each other, with respect to two intermediate level descriptions under attention.

The logic verifying device prepares auxiliary signals (B, B') with respect to the pair (b, b') of branches in a symbol simulation, and simulates those auxiliary signals (B, B') like other signals.

The symbol simulation is carried out in same manner as with the first embodiment, but only differs therefrom when transitions to be processed in step 123 are a branch transition and a confluence transition injected into a confluence state having a mutual link.

If a transition to be processed in step 123 is a branch transition, then a signal value updating function and a transition condition function are updated as follows:

V(Ss,s)(x)=V(Ss,s1)(x): element corresponding to a signal other than signal B
=C(t)(V(Ss,s1)(x)): element corresponding to signal B
C(Ss,s)(X)=C(Ss,S1)(X)^V(Ss,s1)(x)(B)

where V(Ss,s1)(x)(B) represents a function which is an element of signal B of V(Ss,s1)(x).

If a transition to be processed in step 123 is a confluence transition injected into a confluence state having a mutual link, then a signal value updating function is updated as follows:

V(Ss,s)(x)=(ite V(Ss,sd)(x)(B), V(Ss,s1)(x), V(Ss,s2)(x))

Finally, in step 13, the auxiliary signals generated with respect to the pair of branches are also processed for comparing signal value functions.

Advantages of the second embodiment will be described below.

In the second embodiment, the behavioral synthesis device indicates a pair of intermediate terminals which are considered as equivalent to each other, and the logic verifying device ascertains that the pair of intermediate terminals are certainly equivalent to each other, and simplifies the signal value updating function and the transition condition function using the intermediate terminals. Generally, the time required to compare functions for equivalence increases as the functions are more complex. Therefore, the time required for verification can be shortened by simplifying the functions to be compared using the intermediate terminals.

While preferred embodiments of the present invention have been described in specific terms, such description is for illustrative purposes only, and it is to be understood that changes and variations may be made without departing from the spirit or scope of the following claims.

What is claimed is:

1. A method of verifying an equivalence between a behavioral description and a register transfer level description, comprising the steps of:
   extracting an associated relation from a behavioral synthesis device for deriving an associated relation between the behavioral description and the register transfer level description; and
   checking the equivalence between the behavioral description and the register transfer level description.

2. A method according to claim 1, further comprising the steps of:
   extracting, from a behavioral synthesis device for deriving a register transfer level description through a plurality of steps from a behavioral description, an associated relation between intermediate level descriptions subsequent to the respective steps and intermediate level descriptions prior to the respective steps; and
   checking the equivalence between the intermediate level descriptions prior and subsequent to the steps to verify the equivalence between the behavioral description and the register transfer level description.

3. A method according to claim 2, wherein the equivalence between the behavioral description and the register transfer level is verified by extracting a model capable of expressing a control structure based on a finite state machine and an update of a signal value from each of the descriptions, performing a symbolic simulation on said model to express the update of the signal value with a function, and verifying that updating functions for corresponding signals are equivalent to each other.

4. A method according to claim 3, wherein said model is extracted by a conversion into a model such that two transitions are necessarily injected into a confluence state, and the symbolic simulation is performed by expressing the update of a signal value subsequent to a confluence with a function using an expression of if-then-else when the confluence state is reached.

5. A method according to claim 4, wherein said associated relation includes information of a pair of branches whose branch conditions are equivalent to each other, the symbolic simulation is performed by performing a simulation using auxiliary signals with respect to the pair of branches, and the auxiliary signals generated with respect to the pair of branches are processed for comparing signal value functions.

6. A method according to claim 5, wherein the symbolic simulation is performed by expressing an input of a value from an input terminal and an output of a value to an output terminal with functions.

7. A method according to claim 4, wherein the symbolic simulation is performed by expressing an input of a value from an input terminal and an output of a value to an output terminal with functions.

8. A method according to claim 3, wherein said associated relation includes information of a pair of branches whose branch conditions are equivalent to each other, the symbolic simulation is performed by performing a simulation using auxiliary signals with respect to the pair of branches, and the auxiliary signals generated with respect to the pair of branches are processed for comparing signal value functions.

9. A method according to claim 3, wherein the symbolic simulation is performed by expressing an input of a value from an input terminal and an output of a value to an output terminal with functions.

10. A method according to claim 8, wherein the symbolic simulation is performed by expressing an input of a value from an input terminal and an output of a value to an output terminal with functions.

11. An apparatus for verifying an equivalence between a behavioral description and a register transfer level description, comprising:
    means for extracting an associated relation from a behavioral synthesis device for deriving an associated relation between the behavioral description and the register transfer level description; and
    means for checking the equivalence between the behavioral description and the register transfer level description.

12. An apparatus according to claim 11, further comprising:
    means for extracting, from a behavioral synthesis device for deriving a register transfer level description through a plurality of steps from a behavioral description, an associated relation between intermediate level descriptions subsequent to the respective steps and intermediate level descriptions prior to the respective steps; and
    means for checking the equivalence between the intermediate level descriptions prior and subsequent to the steps to verify the equivalence between the behavioral description and the register transfer level description.

13. An apparatus according to claim 12, further comprising:
    model extracting means for extracting a model capable of expressing a control structure based on a finite state machine and an update of a signal value as a model corresponding to each of the descriptions prior and subsequent to the steps, from an associated relation between a behavioral description which is an input to the behavioral synthesis device, an intermediate level description subsequent to each of the steps which are extracted from the behavioral synthesis device, a register transfer level description which is an output from the behavioral synthesis device, and descriptions prior and subsequent to the steps which are extracted from the behavioral synthesis device;

signal value function extracting means for performing a symbolic simulation on the extracted model to extract signal value functions for updating signal values prior and subsequent to the steps; and function equivalence comparing means for verifying the equivalence between the signal value functions prior and subsequent to the steps.

14. An apparatus according to claim 13, wherein said model extracting means comprises means for carrying out a conversion into a model such that two transitions are necessarily injected into a confluence state, and said signal value function extracting means comprises means for performing the symbolic simulation by expressing the update of a signal value subsequent to a confluence with a function using an expression of if-then-else when the confluence state is reached.

15. An apparatus according to claim 14, wherein said associated relation includes information of a pair of branches whose branch conditions are equivalent to each other, said signal value function extracting means comprises means for performing the symbolic simulation by performing a simulation using auxiliary signals with respect to the pair of branches, and said function equivalence comparing means comprises means for processing the auxiliary signals generated with respect to the pair of branches for comparing signal value functions.

16. An apparatus according to claim 14, wherein the symbolic simulation is performed by expressing an input of a value from an input terminal and an output of a value to an output terminal with functions.

17. An apparatus according to claim 15, wherein the symbolic simulation is performed by expressing an input of a value from an input terminal and an output of a value to an output terminal with functions.

18. An apparatus according to claim 13, wherein said associated relation includes information of a pair of branches whose branch conditions are equivalent to each other, said signal value function extracting means comprises means for performing the symbolic simulation by performing a simulation using auxiliary signals with respect to the pair of branches, and said function equivalence comparing means comprises means for processing the auxiliary signals generated with respect to the pair of branches for comparing signal value functions.

19. An apparatus according to claim 18, wherein the symbolic simulation is performed by expressing an input of a value from an input terminal and an output of a value to an output terminal with functions.

20. An apparatus according to claim 13, wherein the symbolic simulation is performed by expressing an input of a value from an input terminal and an output of a value to an output terminal with functions.

21. An equivalence verifying apparatus having a program for enabling a computer to function as means for extracting a model capable of expressing a control structure based on a finite state machine and an update of a signal value as a model corresponding to each of the descriptions prior and subsequent to the steps, from a behavioral description which is an input to a behavioral synthesis device, which derives a register transfer level description through a plurality of steps from a behavioral description, intermediate level descriptions subsequent to each of the steps which are extracted from the behavioral synthesis device, a register transfer level description which is an output from the behavioral synthesis device, and associated relations between descriptions prior and subsequent to the steps which are extracted from the behavioral synthesis device, signal value function extracting means for performing a symbolic simulation on the extracted model to extract signal value functions for updating signal values prior and subsequent to the steps, and function equivalence comparing means for verifying the equivalence between the signal value functions prior and subsequent to the steps.

22. An equivalence verifying apparatus having a program according to claim 21, wherein said model extracting means comprises means for carrying out a conversion into a model such that two transitions are necessarily injected into a confluence state, and said signal value function extracting means comprises means for performing the symbolic simulation by expressing the update of a signal value subsequent to a confluence with a function using an expression of if-then-else when the confluence state is reached.

23. An equivalence verifying apparatus having a program according to claim 22, wherein said associated relation includes information of a pair of branches whose branch conditions are equivalent to each other, said signal value function extracting means comprises means for performing the symbolic simulation by performing a simulation using auxiliary signals with respect to the pair of branches, and said function equivalence comparing means comprises means for processing the auxiliary signals generated with respect to the pair of branches for comparing signal value functions.

24. An equivalence verifying apparatus having a program according to claim 23, wherein the symbolic simulation is performed by expressing an input of a value from an input terminal and an output of a value to an output terminal with functions.

25. An equivalence verifying apparatus having a program according to claim 22, wherein the symbolic simulation is performed by expressing an input of a value from an input terminal and an output of a value to an output terminal with functions.

26. An equivalence verifying apparatus having a program according to claim 21, wherein said associated relation includes information of a pair of branches whose branch conditions are equivalent to each other, said signal value function extracting means comprises means for performing the symbolic simulation by performing a simulation using auxiliary signals with respect to the pair of branches, and said function equivalence comparing means comprises means for processing the auxiliary signals generated with respect to the pair of branches for comparing signal value functions.

27. An equivalence verifying apparatus having a program according to claim 26, wherein the symbolic simulation is performed by expressing an input of a value from an input terminal and an output of a value to an output terminal with functions.

28. An equivalence verifying apparatus having a program according to claim 21, wherein the symbolic simulation is performed by expressing an input of a value from an input terminal and an output of a value to an output terminal with functions.

* * * * *